United States Patent
Chu et al.

(10) Patent No.: US 6,251,751 B1
(45) Date of Patent: Jun. 26, 2001

(54) BULK AND STRAINED SILICON ON INSULATOR USING LOCAL SELECTIVE OXIDATION

(75) Inventors: Jack Oon Chu, Astoria; Khalid Ezzeldin Ismail, Yorktown Heights, both of NY (US); Kim Yang Lee, Fremont, CA (US); John Albrecht Ott, Greenwood Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/290,778

(22) Filed: Apr. 13, 1999

Related U.S. Application Data

(62) Division of application No. 08/951,827, filed on Oct. 16, 1997, now Pat. No. 5,963,817.

(51) Int. Cl.$^7$ .................................................. H01L 21/76
(52) U.S. Cl. ..................... 438/439; 438/400; 438/410; 257/55; 257/63; 257/352; 257/750
(58) Field of Search .................................... 438/400, 410, 438/439, 778; 427/96; 257/750, 55, 191, 63, 352

(56) References Cited

U.S. PATENT DOCUMENTS

| | | | |
|---|---|---|---|
| 5,670,412 | 9/1997 | Juengling et al. | 438/439 |
| 5,783,498 | 7/1998 | Dotta | 438/778 |
| 5,958,505 | * 9/1999 | Mantl | 427/96 |

OTHER PUBLICATIONS

Solid State Phenomena, vols. 47–48 (1996), pp. 17–32, Scitec Publications, Switzerland 1996.

* cited by examiner

Primary Examiner—Charles Bowers
Assistant Examiner—Hsien-Ming Lee
(74) Attorney, Agent, or Firm—Robert M. Trepp

(57) ABSTRACT

A method for forming buried oxide regions below a single crystal semiconductor layer incorporating the steps of forming epitaxial layers having different rates of oxidation with the lower layer having a faster rate of oxidation and oxidizing the layers through an opening in a mask. A plurality of oxide isolated FET's may be formed. The invention reduces the problem of source/drain parasitic capacitance and short channel effects while isolating FET's and eliminating floating body effects of an FET by selectively oxidizing semiconductor layers.

20 Claims, 6 Drawing Sheets

Oxide Etch

2nd Wet Oxidation @ 750°C

BULK AND STRAINED SILICON ON INSULATOR USING LOCAL SELECTIVE OXIDATION

This is a continuation division of application Ser. No. 08/951,827, now U.S. Pat. No. 5,963,817 filed Oct. 16, 1997.

FIELD OF THE INVENTION

This invention relates to forming bulk or strained Si/SiGe layered regions adjacent to or on an insulator and more particularly to local selective oxidation of SiGe for forming an insulator region underneath semiconductor regions for device applications such as complementary metal-oxide-semiconductor (CMOS) field effect transistors (FET's), modulation-doped field-effect transistors (MODFET's), dynamic random access memories (DRAM's), mixed DRAM and CMOS, static random access memories (SRAM's), BiCMOS, and rf.

BACKGROUND OF THE INVENTION

In silicon semiconductor technology, the only way to achieve insulating substrates is by resorting either to silicon on insulator (SOI), silicon on sapphire (SOS), or etch and bond back to achieve SOI. The main advantage of using an insulating substrate in CMOS and high speed FET's is to reduce the parasitic junction capacitance and the short channel effects and thus, increase the speed performance of the devices. One major problem with all of the above methods is that the insulator covers the entire wafer and consequently, the entire device area including underneath the ohmic contacts and channel of a FET. The buried oxide over an entire wafer results in the well known 'floating body' problem, since the semiconductor substrate is floating with respect to the channel. This problem has adverse affects on threshold voltage control and circuit operation. The other problem with the above solutions is that they are far more expensive than regular bulk silicon substrates. In addition, there is no simple way of getting strained silicon on insulator, which would have higher electron and hole transport properties.

SUMMARY OF THE INVENTION

In accordance with the present invention, a method for forming buried oxide regions below a region of a single crystal semiconductor layer is described comprising the steps of selecting a single crystal silicon substrate, forming a first epitaxial layer of constant or graded SiGe on the upper surface of the substrate having a first rate of oxidation. This layer can be either strained or relaxed SiGe or lattice matched SiGeC. Then forming a second epitaxial layer containing silicon on the first layer having a second rate of oxidation less than the first rate of oxidation, forming a mask over the second layer, patterning the mask to form openings in the mask, and oxidizing through the mask openings the second layer and the first layer whereby an oxide region forms having portions replacing portions or all of the first layer underneath the second layer.

The invention further provides forming FET's with its channel in the second layer above remaining portions of the first layer.

BRIEF DESCRIPTION OF THE DRAWINGS

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
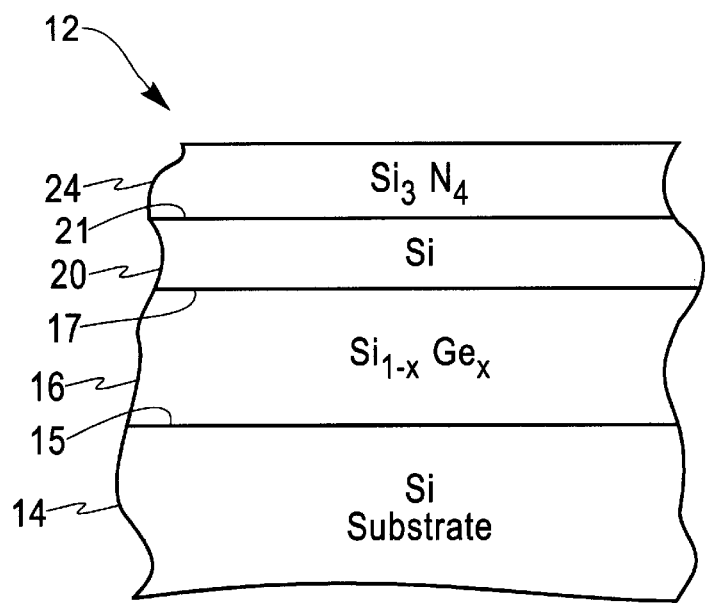
FIGS. 1 and 2 are cross section views of a layered structure illustrating the steps in practicing the invention.

Referring to FIG. 1, a cross section view of a layered structure 12 is shown to illustrate initial process steps. First, a single crystal semiconductor substrate 14 is selected which may be Si, SiGe, etc. Next, an epitaxial layer 16 of constant or graded $Si_{1-x}Ge_x$ or $(Si_{1-x}Ge_x)_aC_{1-a}$ is formed on the upper surface 15 of substrate 14. For a description of UHV-CVD methods for growing silicon containing films, reference is made to U.S. Pat. No. 5,298,452 by B. S. Meyerson which issued Mar. 29, 1994 entitled "Method and Apparatus for Low Temperature, Low Pressure Chemical Vapor Deposition of Epitaxial Silicon Layers" which is incorporated herein by reference. Epitaxial layer 16 may have a Ge content X in the range from 0.15 to 0.25. Epitaxial layer 16 has a first rate of thermal oxidation at a specified temperature and ambient. The ambient may include oxygen, water vapor and/or HCl. The constant or graded composition of epitaxial layer 16 is required to grow epitaxially even where layer 14 and 16 have different lattice constants, and is selected to have a first rate of thermal oxidation. The thickness of epitaxial layer 16 is adjusted to be below or above the critical thickness to provide a strained or relaxed layer respectively. For a description of forming relaxed layers of SiGe, reference is made to U.S. Pat. No. 5,659,187 by F. K. LeGoues and B. S. Meyerson which issued Aug. 19, 1997 entitled "Low Defect Density/Arbitrary Lattice Constant Heteroepitaxial Layers" which is incorporated herein by reference.

Next, an epitaxial layer 20 of Si or $Si_{1-y}Ge_y$ is formed on the upper surface 17 of epitaxial layer 16. Epitaxial layer 20 may have a constant or graded Ge content Y where Y is less than X and may be zero. The composition of layer 20 is chosen so that layer 20 has a second rate of oxidation less than the rate of oxidation of layer 16 and has desired electrical properties.

Figure 2:
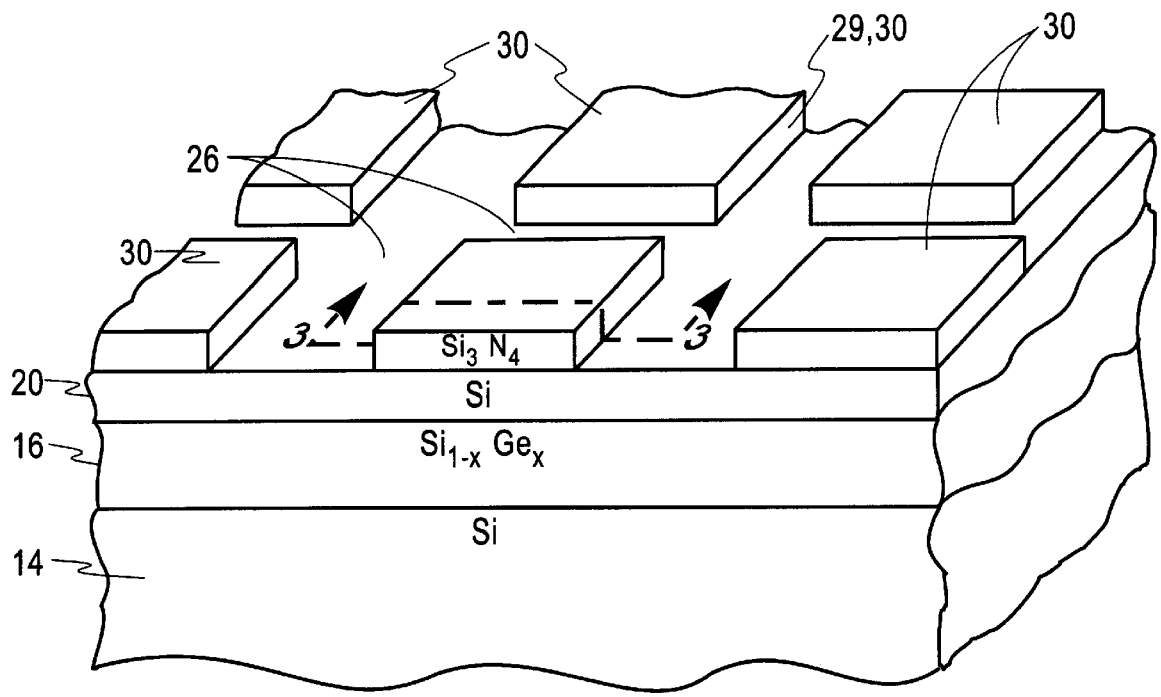

Next, a mask 24 is formed over the upper surface 21 of layer 20. Mask 24 may be a blanket layer of silicon nitride or of other material such as a material that is slow or resistant to oxidation or a material which is already an oxide. Silicon nitride is a preferred material because it can be selectively removed with respect to an oxide i.e. silicon dioxide. Mask 24 is patterned to form openings 26 as shown in FIG. 2. Openings 26 may extend along a path or pattern to form a mask shape 29 or a number of mask shapes 30 shown in FIG. 2. Mask shapes 30 may form a rectangle, square, and/or circle. Other shapes may also be formed by the pattern of openings 26. Mask shapes 30 may be a plurality of rectangles and/or squares having dimensions of 1 μm by 1 μm or less. Mask shapes and size may be selected to accommodate one device on a single area of Si or SiGe surrounded entirely by oxide with a remaining portion or no portion of SiGe below in contact with substrate 14.

Figure 3:
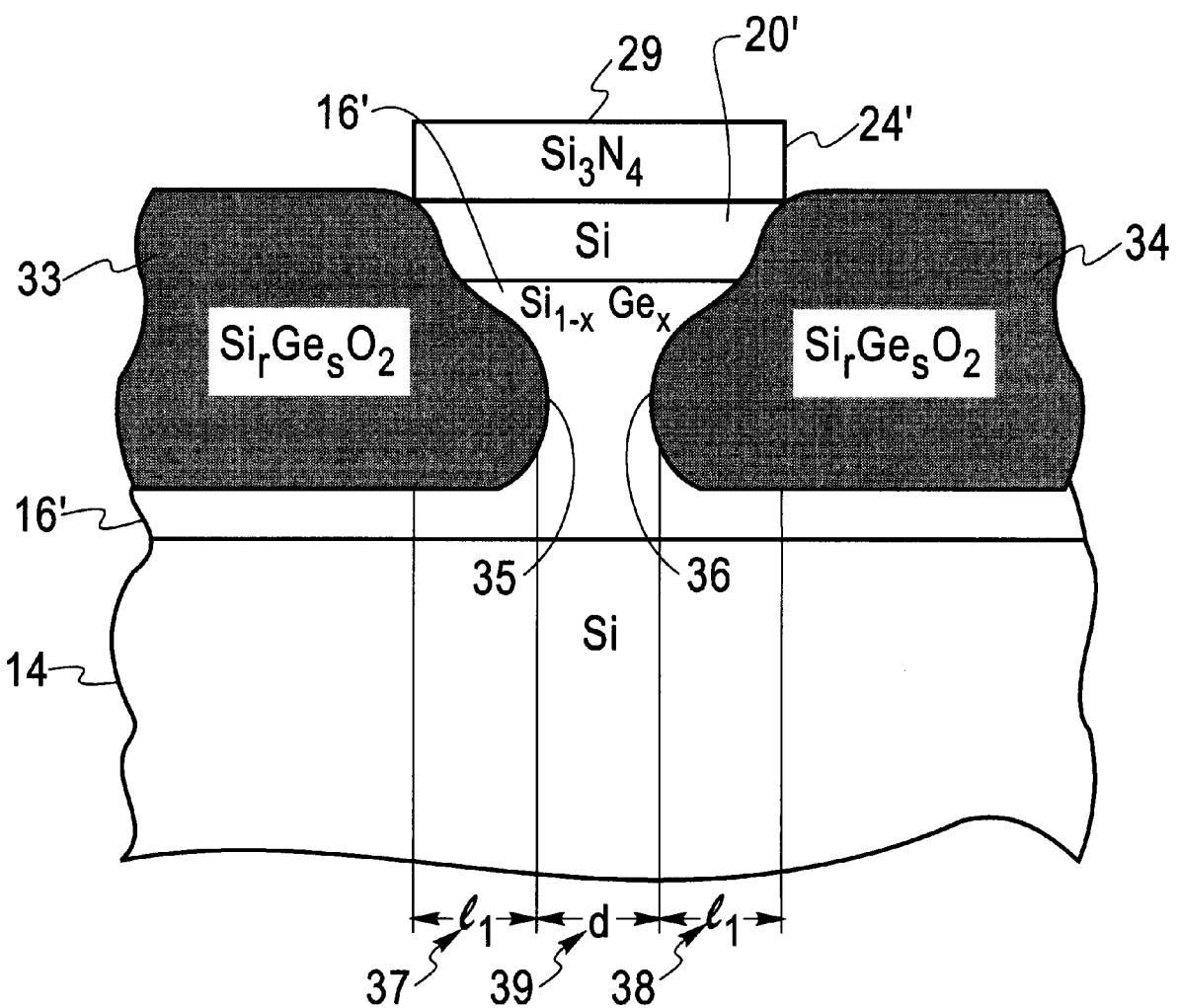
FIG. 3 is a cross section view along the line 3—3 of FIG. 2 after the oxidation step illustrating one embodiment of the invention.

Next, layered structure 12 is placed in an oxidizing ambient at a temperature to oxidize epitaxial layers 16 and 20 through openings 26 and hence around the edges of masks shapes 30. Dependent on the three dimensional composition profile of Ge in SiGe, the three dimensional doping profile of, boron in layers 16 and 20 and the time of oxidation, oxide 33 and 34 are formed as shown in FIG. 3 and could and terminate in layer 16' or extend through layer 16' and terminate in substrate 14. The oxidizing ambient may be wet thermal oxidation in steam, oxygen and/or hydrochloric acid at a temperature in the range from 700° C. to 950° C. and preferably in the range from 700° C. to 800° C. For example at 750° C., Si has an oxidation rate in the range from 0.5 to 1 nm/min. SiGe with 7% Ge has an oxidation rate of about 3.5 nm/min. SiGe with 16% Ge has an oxidation rate of about 5.2 nm/min. SiGe with 53.5% Ge has an oxidation rate of about 44 nm/min. SiGe with 76.6% Ge has an oxidation rate of about 66 nm/min. For more data on oxidation rates of SiGe as a function of temperature and as a function of composition for rapid thermal dry and wet oxidation (RTO), reference is made to a publication by U. Konig and J. Hersener, entitled "Needs of Low Thermal Budget Processing in SiGe Technology" Solid State Phenomena Vols. 47–48 (1996) pp. 17–32 published by Scitec Publications, Switzerland.

FIG. 3 is a cross section view along the line 3—3 of FIG. 2 after oxidation of epitaxial layers 16 and 20 around the edges of mask 29 through openings 26 shown in FIG. 2. As shown in FIG. 3, epitaxial layer 20 is totally consumed by oxide regions 33 and 34 except below mask shape 29. Epitaxial layer 16 is almost or totally consumed below openings 26 and extends laterally in layer 16 below layer 20'. The oxide formed is $Si_rGe_sO_2$ where r and s have values in the range from greater than 0 to 2 dependent on the Ge content in layer 16 as a function of thickness and on the oxidation conditions.

Figure 4:
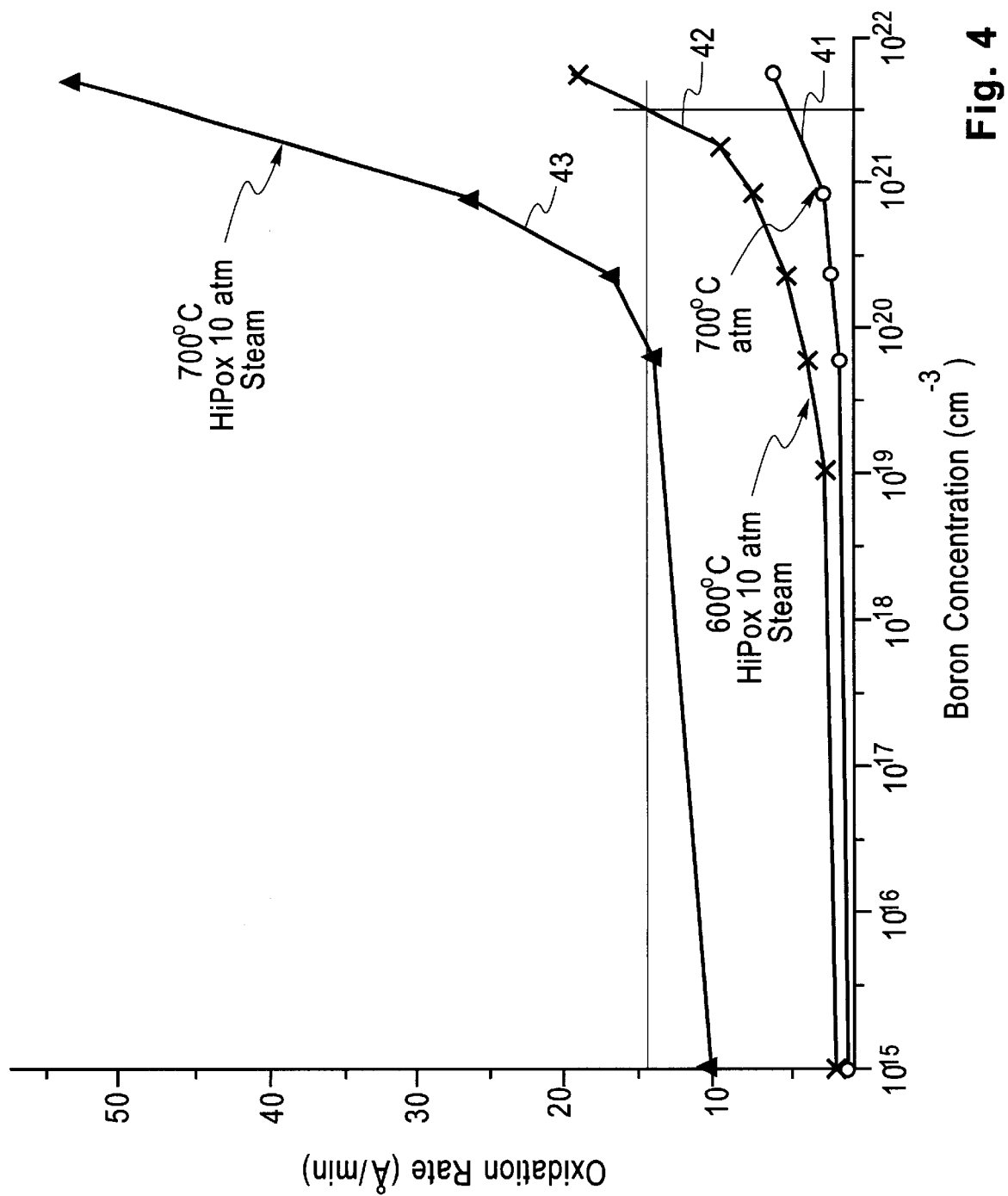
FIG. 4 is a graph of the oxidation rate of silicon versus boron concentration at various temperatures and ambients.

Oxides 33 and 34 extend in layer 16 underneath layer 20' where layer 16' has a rate of oxidation greater than the rate of oxidation of layer 20' which is controlled by the grading of Ge in SiGe and by the doping profile of boron, if any is present. Boron may be doped up to $10^{21}$ atoms/cc to enhance oxidation of SiGe. The amount of germanium provides a corresponding increase in the oxidation rate. The amount of boron provides a corresponding increase in oxidation rate as shown in FIG. 4. In FIG. 4, the ordinate represents oxidation rate (Å/min) and the abscissa represents boron concentration ($cm^{-3}$). Curve 41 shows the oxidation rate of silicon as a function of boron concentration at 700° C. in oxygen at 1 atmosphere pressure. Curve 42 shows the oxidation rate of silicon as a function of boron concentration at 600° C. in oxygen and steam at 10 atmospheres pressure also known as High Pressure Oxidation (HIPOX). Curve 43 shows the oxidation rate of silicon as a function of boron concentration at 700° C. in oxygen and steam at 10 atmospheres pressure. HIPOX may occur at pressures in the range from 1 to 20 atmospheres and typically at 12 atmospheres in an oxygen containing ambient. The presence of both Ge and B provide a cumulative increase in the oxidation rate. Thus three dimensional profiles of Ge composition in SiGe in layer 16 and three dimensional profiles of boron concentration in layers 14, 16 and 20 can provide a predetermined profile as a function of time of the peripheral surface or leading edges 35 and 36 of oxides 33 and 34 respectively. Arrows 37 and 38 show the respective lengths $l_1$, and $l_2$ of oxides 33 and 34 extending underneath mask shape 29. Layer 20' is also oxidized with respect to mask shape 29 but extends much less underneath mask shape 29 due to the lower oxidation rate. With the oxidation of Si and SiGe layers, the thickness of the resulting oxidized material increases as shown (not to scale) in FIG. 3.

By continuing the step of oxidation at one or more temperatures as a function of time, the lengths $l_1$ and $l_2$ which are are equal for constant composition in the growth plane of layers 16 and 20 may be determined or controlled. The spacing d shown by arrow 39 may likewise by determined or controlled. The spacing d allows ohmic contact to layer 16' and substrate 14 to control the voltage on the body of a field effect transistor formed in layer 20' and thus prevent the floating body effect due to accumulated charge. Typically, spacing d would be less than the gate length of a FET. Oxides 33 and 34 may join together for the case where spacing d is zero in which case layer 20' would be isolated electrically from substate 14.

Figure 5:
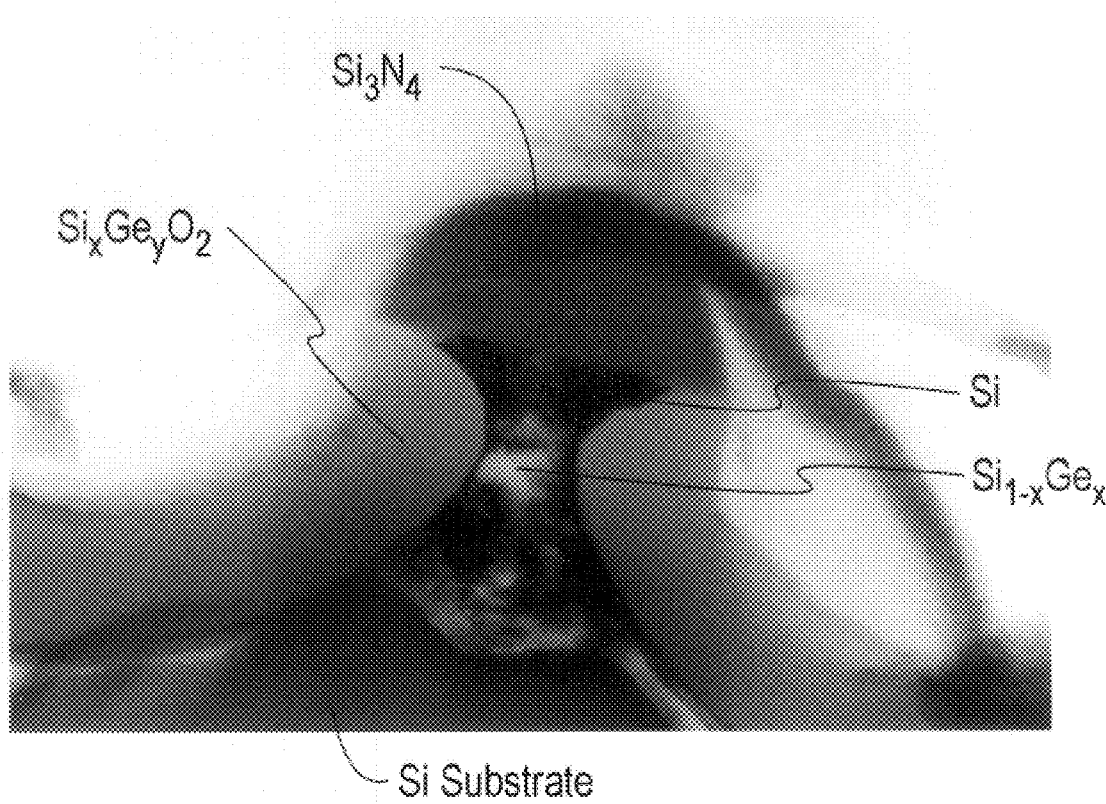
FIG. 5 is a TEM of a fabricated sample of the embodiment shown in FIG. 3.

FIG. 5 is a Transmission Electron Microscope (TEM) of a fabricated sample of the embodiment of FIG. 3. FIG. 5 shows a substantial correspondence to the view in FIG. 3. In FIG. 5, $l_1$ and $l_2$ are about 0.17 μm. The spacing d is about 0.15 μm. Mask shape 29 has a width of 0.5 μm. In FIG. 5, like reference numerals are used for the apparatus in FIG. 3 and incorporate the same materials as described with respect to FIG. 3.

Figure 6:
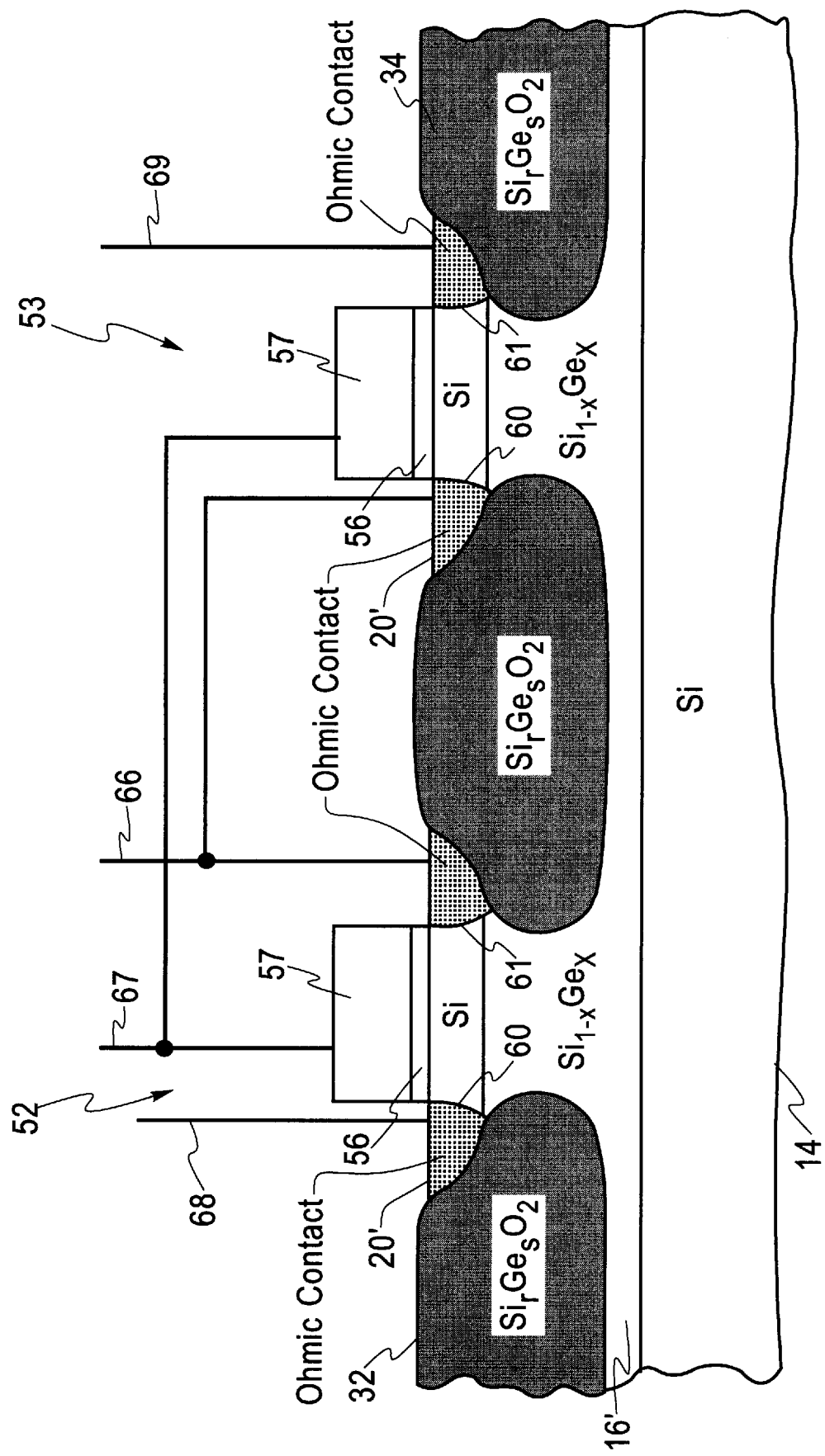
FIG. 6 is a cross section view of a second embodiment of the invention illustrating a plurality of FET's.

FIG. 6 is a cross section view of a FET's 52 and 53. In FIG. 6, like reference numerals are used for the same structural elements as shown in FIG. 3. Mask shape 29 (not shown) which may be silicon nitride is removed. A gate dielectric 56 such as silicon dioxide may be formed above layer 20' for transistors 52 and 53, respectively. A polysilicon layer may be formed over gate dielectric 56 and patterned to form gate electrode 57 for transistors 52 and 53, respectively. Using gate electrode 57, source region 60 and drain region 61 may be formed by ion implantation and ohmic contact implants may be formed extending to the upper surface of oxides 32, 33 and 34. A gate sidewall spacer may be formed on the sidewalls of gate electrode 57 (not shown) prior to forming self aligned ohmic contact implants. With ohmic contacts extending to the surface of oxides 32, 33 and 34, parasitic junction capacitances with layer 16' are reduced because of the three times lower dielectric constant of oxide compared to Si, in addition to the absence of a p–n junction. For a channel width of 0.13 μm, the parasitic junction capacitance of source 60 and drain 61 may be less than 0.02 fF/μm². By positioning oxide 32, 33 and 34 underneath source 60 and drain 61, short channel effects are reduced by preventing a depletion region from extending into the channel as the drain bias voltage is increased. FET 52 may be n-type and FET 53 may be p-type to form CMOS circuits. Each FET source and drain may be doped with the appropriate dopant by masking off the other FET reserved for the opposite dopant during ion implantation. A CMOS circuit is well know in the art where the drain of one FET is couple to the source of the other via lead 66 to form an output. The gate electrodes are coupled together via lead 67 to form an input. Ground and a power supply voltage are coupled to the remaining source and drain of respective FET's via leads 68 and 69.

Figure 7:
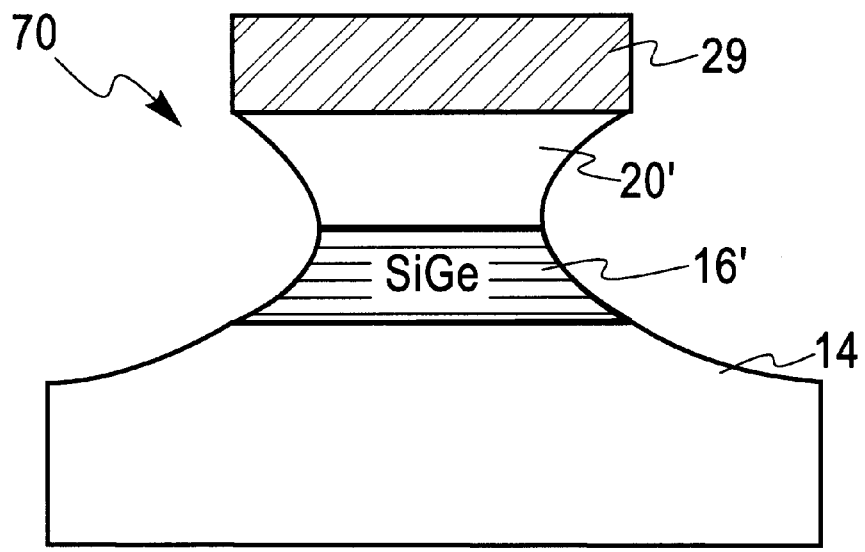
FIG. 7 is a cross section view of a layered structure illustrating an additional step of removing the oxide formed during the step of oxidation.

FIG. 7 is a cross section view of a layered structure 70 similar to the structure shown in FIG. 3 but with oxide 33 and 34 removed. Oxide 33 and 34 may be removed by etching such as by etching with buffered HF.

Subsequent to removal of oxide 33 and 34, exposed-layers 14, 16' and 20' may be exposed to an oxidation ambient to resume oxidation of layer 16' and to a lesser extent layers 14 and 20' depending upon the oxidation rate. Oxide 33 and 34 may act to block or slow down oxidation of layer 16'. Thus removal of oxide 33 and 34, speeds up oxidation of layer 16'.

Figure 8:
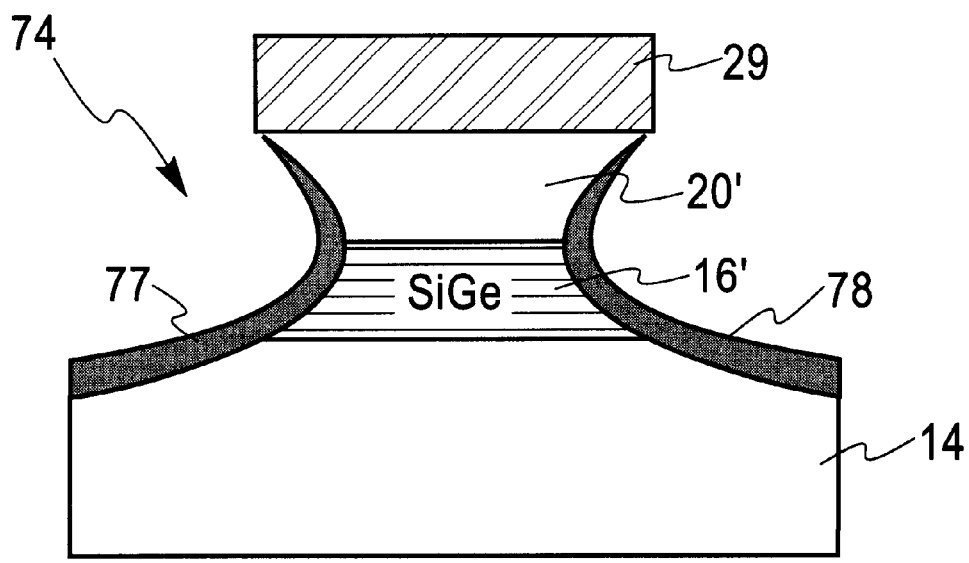
FIG. 8 is a cross section view illustrating an additional step of oxidation.

FIG. 8 is a cross section view of layered structure 74 after substrate 14 and layers 16' and 20' are further oxidized as shown by oxide regions 77 and 78.

The steps of oxide removal and oxidation of the layered structure in an oxidizing ambient may be repeated a number of times. After the desired structure has been formed, a dielectric such as silicon oxide, may be used to fill in the voids formed by oxide removal. Chemical mechanical processes may be used to form a planar upper surface for further processing to form useful semiconductor devices.

In FIGS. 7 and 8, like references are used for structures corresponding to the apparatus of FIG. 3.

While there has been described and illustrated a process for forming buried oxide regions below a region of a single crystal semiconductor layer which is under strain or relaxed with ohmic contact to the substrate and a FET structure with submicron channel lengths for device and circuit applications such as CMOS, MODFET's, DRAM'S, SRAM'S, rf, BiCMOS and mixed DRAM and CMOS, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A structure for forming an electronic device therein comprising:
    a single crystal silicon containing substrate,
    a first epitaxial layer selected from the group consisting of $Si_{1-x}Ge_x$ and $(Si_{(1-x)}Ge_x)_aC_{1-a}$ on the upper surface of said substrate,
    a second single crystal layer containing silicon on said first epitaxial layer, and
    first and second oxide regions spaced apart, each said first epitaxial and second oxide regions extending in said first epitaxial layer below said second single crystal layer.

2. The structure of claim 1 wherein said first and second oxide regions are formed in said first epitaxial layer and said second single crystal layer.

3. The structure of claim 1 wherein said first and second oxide regions are spaced apart in said first epitaxial layer in the range from 0.01 to 0.5 $\mu$m.

4. The structure of claim 1 wherein said first and second oxide regions enclose a portion of said second single crystal layer.

5. The structure of claim 4 wherein said enclosed portion of said second single crystal layer forms at its upper surface a shape selected from the group consisting of a rectangle, square, and circle.

6. The structure of claim 5 further including a plurality of enclosed portions of said second single crystal layer, each enclosed portions of said first epitaxial layer less than 1 $\mu$m by 1 $\mu$m.

7. The structure of claim 4 wherein said first epitaxial layer between said first and second oxide regions is underneath and in contact with said enclosed portion of said second single crystal layer.

8. The structure of claim 1 wherein said first epitaxial layer includes a layer of graded composition of Ge.

9. The structure of claim 1 wherein said first epitaxial layer includes boron doping.

10. The structure of claim 1 wherein said second single crystal layer is under strain due to the lattice parameters of the upper surface of said first epitaxial layer.

11. The structure of claim 1 wherein said first and second oxide regions extend through said first epitaxial layer into said substrate.

12. The structure of claim 1 further including spaced apart source and drain regions in said second single crystal layer extending down to the upper surface of said first and second oxide regions, respectively to define a channel in said second single crystal layer.

13. The structure of claim 12 further including a dielectric above said channel and a gate electrode on said dielectric to form a field effect transistor.

14. The structure of claim 13 further including ohmic contacts to said source and drain extending to the upper surface of said first and second oxide regions.

15. The structure of claim 13 wherein said channel is under strain.

16. The structure of claim 13 wherein said first epitaxial layer has a graded composition of Ge to lattice strain said channel in said second single crystal layer.

17. The structure of claim 13 wherein said first epitaxial layer is relaxed.

18. The structure of claim 13 wherein said second single crystal layer is commensurate with said first epitaxial layer.

19. The structure of claim 13 further including a plurality of said field effect transistors of n and p type respectively.

20. The structure of claim 19 further including interconnection wiring to form complementary metal oxide semiconductor (CMOS) circuits.

* * * * *